(12) United States Patent
You et al.

(10) Patent No.: US 10,115,873 B2
(45) Date of Patent: Oct. 30, 2018

(54) SURFACE-MODIFIED PHOSPHOR AND LIGHT EMITTING DEVICE

(71) Applicant: Samsung Display Co., Ltd., Yongin-Si, Gyeonggi-Do (KR)

(72) Inventors: Junwoo You, Seongnam-si (KR); Sanghyuk Lee, Anyang-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 202 days.

(21) Appl. No.: 15/058,289

(22) Filed: Mar. 2, 2016

(65) Prior Publication Data

US 2017/0040505 A1 Feb. 9, 2017

(30) Foreign Application Priority Data

Aug. 7, 2015 (KR) .................. 10-2015-0111572

(51) Int. Cl.
| | |
|---|---|
| *C09K 11/08* | (2006.01) |
| *H01L 33/50* | (2010.01) |
| *C09K 11/61* | (2006.01) |
| *C09K 11/67* | (2006.01) |
| *C09K 11/77* | (2006.01) |

(52) U.S. Cl.
CPC ........ *H01L 33/507* (2013.01); *C09K 11/0883* (2013.01); *C09K 11/617* (2013.01); *C09K 11/671* (2013.01); *C09K 11/7706* (2013.01); *H01L 33/502* (2013.01); *H01L 2224/48091* (2013.01); *H01L 2224/48247* (2013.01); *H01L 2224/48257* (2013.01); *H01L 2924/181* (2013.01); *H01L 2933/0041* (2013.01)

(58) Field of Classification Search
None
See application file for complete search history.

(56) References Cited

U.S. PATENT DOCUMENTS

| | | | | |
|---|---|---|---|---|
| 2004/0144956 | A1* | 7/2004 | Kijima | C09K 11/08 252/301.4 R |
| 2009/0026915 | A1* | 1/2009 | Nagatomi | C09K 11/0883 313/503 |
| 2012/0313045 | A1* | 12/2012 | Shim | C09D 7/1275 252/301.36 |
| 2014/0327023 | A1* | 11/2014 | Brewster | H01L 33/504 257/98 |

FOREIGN PATENT DOCUMENTS

| | | |
|---|---|---|
| KR | 1020090050724 A | 5/2009 |
| KR | 1020110003967 A | 1/2011 |
| KR | 1020110038937 A | 4/2011 |
| KR | 1020120028458 A | 3/2012 |
| KR | 1020140093324 A | 7/2014 |

\* cited by examiner

*Primary Examiner* — Nathan T Leong
(74) *Attorney, Agent, or Firm* — Cantor Colburn LLP

(57) ABSTRACT

A surface-modified phosphor includes: a phosphor matrix represented by Chemical Formula 1,

$K_2SiF_6:Mn^{4+}$; and  Chemical Formula 1 a nano-sized phosphor coated on the phosphor matrix.

16 Claims, 10 Drawing Sheets

SURFACE-MODIFIED PHOSPHOR AND LIGHT EMITTING DEVICE

CROSS-REFERENCE TO RELATED APPLICATION

This application claims the priority to and all the benefits accruing under 35 U.S.C. § 119 to Korean Patent Application No. 10-2015-0111572, filed on Aug. 7, 2015, with the Korean Intellectual Property Office ("KIPO"), the content of which is incorporated herein in its entirety by reference.

BACKGROUND

1. Field

This disclosure relates to a surface-modified phosphor, to a method of manufacturing the surface-modified phosphor, and to a light emitting device including the surface-modified phosphor.

2. Description of the Related Art

Display devices may be classified as a self-emission type display device that emits light to display an image or as a light-receiving type display device that controls light emitted by a separate light source to display an image. A representative example of the light-receiving type display device is a liquid crystal display ("LCD") device.

The LCD device is one type of flat panel display devices that have found a wide range of applications, and includes two substrates including field generating electrodes formed thereon, such as a pixel electrode and a common electrode, a liquid crystal layer between the two substrates, and a backlight device providing light to the liquid crystal layer. The LCD device applies a voltage to the field generating electrodes so as to generate an electric field over the liquid crystal layer, and orientation of the liquid crystal molecules of a liquid crystal layer is determined based on the electric field so that an amount of light emission of the backlight device is controlled, such that an image may be displayed. The backlight device includes a light source emitting light, a light guide plate dispersing the light emitted by the light source to convert the light into a surface light source, and various diffusion films.

The light source that emits light can use a cold cathode fluorescent lamp ("CCFL"), an external electrode fluorescent lamp ("EEFL"), or the like, and a light emitting diode ("LED") is currently widely used.

An LCD device using a color filter desirably receives white light, and to generate the white light, a method of utilizing blue light emitted from an LED to excite a phosphor which absorbs a part of the blue light resulting in excitation luminescence may be employed.

The phosphor may be manufactured through a ball mill process, and the phosphor formed through the ball mill process can have a fine crack, e.g., a fracture, which may or may not penetrate the particle. Due to the fine crack, light efficiency of the phosphor may decrease, and deterioration of the phosphor by heat or moisture may be accelerated. Thus the remains a need for an improved phosphor.

SUMMARY

Aspects of embodiments are directed to a surface-modified phosphor of which a surface is coated with a nanometer-sized phosphor emitting the same color as that of a phosphor matrix.

In addition, aspects of embodiments are directed to a light emitting device including the surface-modified phosphor.

According to an embodiment, a surface-modified phosphor includes: a phosphor matrix including a compound represented by Chemical Formula 1

$K_2SiF_6:Mn^{4+}$; and    Chemical Formula 1 a nano-sized phosphor coated on the phosphor matrix.

The phosphor matrix may have a particle size ranging from about 2 μm to about 200 μm.

The phosphor matrix may have a crack, and the nano-sized phosphor may be disposed in the crack.

The nano-sized phosphor may have a particle size ranging from about 20 nm to about 1000 nm.

The nano-sized phosphor may emit a color which is the same as a color emitted by the phosphor matrix.

The nano-sized phosphor may include at least a compound represented by any one of Chemical Formulas 2 and 3.

$Li_2TiO_3:Mn^{4+}$, and    Chemical Formula 2

$CaAlSiN:Eu^{2+}$.    Chemical Formula 3

According to another embodiment, a method of manufacturing a surface-modified phosphor includes: mixing an alcohol and a phosphor matrix and agitating the mixture to obtain a first agitated material; mixing a nano-sized phosphor and the first agitated material and agitating the mixture to obtain a second agitated material; adding a solvent comprising Zn to the second agitated material and agitating the mixture to obtain a third agitated material; and removing the solvent from the third agitated material to manufacture the surface-modified phosphor.

The phosphor matrix may include a compound represented by Chemical Formula 1

$K_2SiF_6:Mn^{4+}$.    Chemical Formula 1

The alcohol may be ethanol.

The solvent including Zn may be an aqueous solution of $Zn_2SO_4$ having a concentration ranging from about 0.5 weight percent to about 1.5 weight percent, based on a total weight of the aqueous solution.

The phosphor matrix may have a particle size ranging from about 2 μm to about 200 μm.

The nano-sized phosphor may have a particle size ranging from about 20 nm to about 1000 nm.

The nano-sized phosphor may include at least a compound represented by any one of Chemical Formulas 2 and 3.

$Li_2TiO_3:Mn^{4+}$; and    Chemical Formula 2

$CaAlSiN:Eu^{2+}$.    Chemical Formula 3

According to yet another embodiment, a light emitting device includes: a substrate; a light emitting element on the substrate; and a wavelength conversion portion on the light emitting element, the wavelength conversion portion including a surface-modified phosphor, wherein the surface-modified phosphor includes a phosphor matrix including a compound represented by Chemical Formula 1.

$K_2SiF_6:Mn^{4+}$; and    Chemical Formula 1 a nano-sized phosphor coated on the phosphor matrix

The phosphor matrix may have a particle size ranging from about 2 μm to about 200 μm.

The phosphor matrix may have a crack, and the nano-sized phosphor may be disposed in the crack.

The nano-sized phosphor may have a particle size ranging from about 20 nm to about 1000 nm.

The nano-sized phosphor may emit a color the same as a color emitted by the phosphor matrix.

The nano-sized phosphor may include at least a compound represented by any one of Chemical Formulas 2 and 3.

$Li_2TiO_3:Mn^{4+}$, and          Chemical Formula 2

$CaAlSiN:Eu^{2+}$.          Chemical Formula 3

The foregoing is illustrative only and is not intended to be in any way limiting. In addition to the illustrative aspects, embodiments, and features described above, further aspects, embodiments, and features will become apparent by reference to the drawings and detailed description.

BRIEF DESCRIPTION OF THE DRAWINGS

The above and other features and aspects of the present disclosure will be more clearly understood from the following detailed description taken in conjunction with the accompanying drawings, in which.

DETAILED DESCRIPTION

Hereinafter, an embodiment will now be described in more detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art.

All terminologies used herein are merely used to describe embodiments and may be modified according to the relevant art and the intention of an applicant. Therefore, the terms used herein should be interpreted as having a meaning that is consistent with their meanings in the context of the present disclosure, and is not intended to limit the invention.

In the drawings, certain elements or shapes may be simplified or exaggerated for better illustration, and other elements present in an actual product may also be omitted. Thus, the drawings are intended to facilitate understanding. Like reference numerals refer to like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Throughout the specification, a phosphor not having undergone surface treatment such as coating is referred to as "phosphor" or "phosphor matrix," a phosphor having a particle size of several nanometers is referred to as "nano-sized phosphor," and a phosphor having undergone surface treatment is referred to as "surface-modified phosphor."

Figure 1:
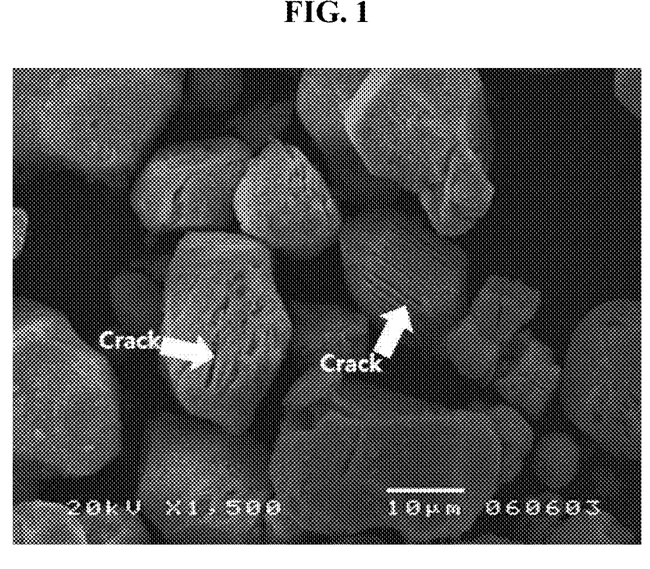
FIG. 1 is a scanning electron micrograph of a phosphor matrix.
Figure 2:
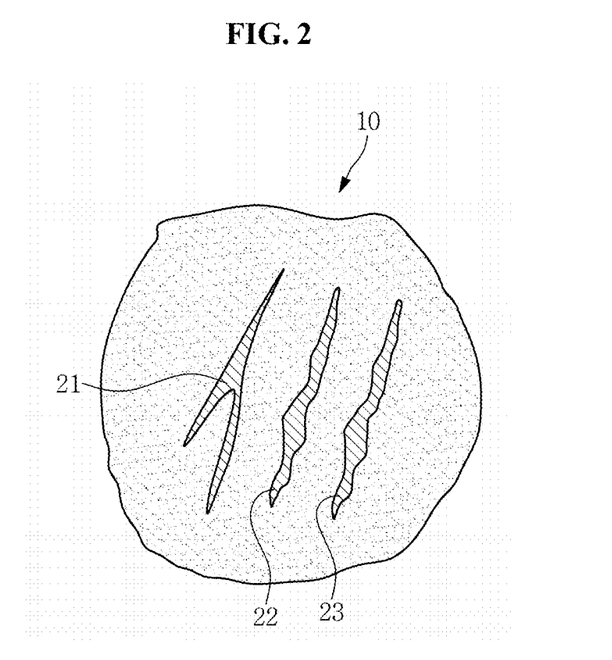
FIG. 2 is a schematic view of a phosphor matrix.

FIG. 1 is a scanning electron micrograph of a phosphor matrix, and FIG. 2 is a schematic view of a phosphor matrix.

A phosphor (phosphor matrix) may be manufactured through a ball mill process. The phosphor manufactured through the ball mill process has cracks 21, 22, and 23 formed on a surface thereof as illustrated in FIGS. 1 and 2 due to the nature of the ball mill process. The cracks 21, 22, and 23 may be called as surface cracks.

The ball mill process is a process in which a material to be ground and a steel ball or a ceramic ball are put in a cylinder-shaped container that is rotatable, and the container is rotated so that the material is ground by impacts caused when the ball is dropped and crushing among the balls. In this regard, based on a diameter of the ball input to the container, a particle size of powder manufactured by the grinding of the material may vary.

$K_2SiF_6:Mn^{4+}$ is a red phosphor that absorbs blue color to emit a red color, and has an excellent color characteristic. The $K_2SiF_6:Mn^{4+}$ phosphor is also referred to as new red phosphor. However, in a case where the $K_2SiF_6:Mn^{4+}$ phosphor manufactured through the ball mill process is used for a relatively long period of time in a high temperature, high humidity environment, a lumen maintenance rate may decrease.

Also, where a phosphor maintains a lumen maintenance rate of about 90% or more after being used for about 2000 hours at a temperature of about 55° C. (see graph FIG. 3, line A1), and maintains a lumen maintenance rate of about 85% or more after being used for about 2000 hours at a temperature of about 60° C. and a humidity of about 75% (see line A2 of FIG. 3), the phosphor is evaluated as having a high color reproducibility and an excellent life characteristic. However, the $K_2SiF_6:Mn^{4+}$ phosphor manufactured through the ball mill process may not satisfy the aforementioned condition.

Figure 3:
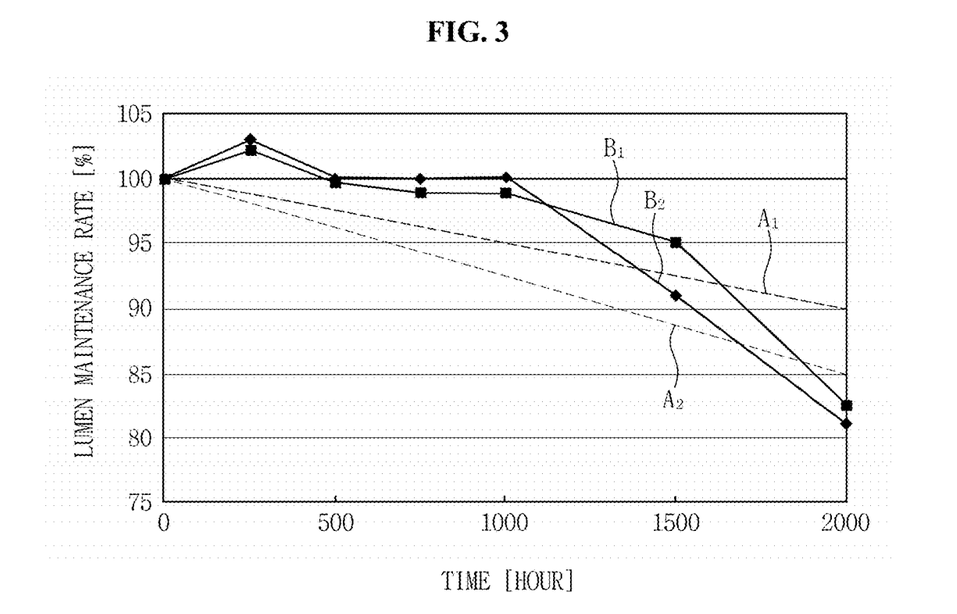
FIG. 3 is a graph of lumen maintenance rate (percent, %) versus time (hours) illustrating a lumen maintenance rate of a $K_2SiF6:Mn^{4+}$ phosphor.

FIG. 3 is a graph illustrating a lumen maintenance rate of a $K_2SiF6:Mn^{4+}$ phosphor manufactured through the ball mill process. In reference to FIG. 3, when the $K_2SiF_6:Mn^{4+}$ phosphor is used for about 2000 hours at a temperature of about 55° C., the lumen maintenance rate of the $K_2SiF_6:Mn^{4+}$ phosphor is decreased to about 90% or less (see results B1 of FIG. 3), and when the $K_2SiF_6:Mn^{4+}$ phosphor is used for about 2000 hours at a temperature of about 60° C. and a humidity of about 75%, the lumen maintenance rate of the $K_2SiF_6:Mn^{4+}$ phosphor is decreased to about 85% or less (see results B2 of FIG. 3).

While not wanting to be bound by theory, it is understood that the reason why the lumen maintenance rate of the $K_2SiF_6:Mn^{4+}$ phosphor decreases is because in the process of manufacturing the $K_2SiF_6:Mn^{4+}$ phosphor through the ball mill process, a plurality of cracks 21, 22, and 23 may occur on a surface of the $K_2SiF_6:Mn^{4+}$ phosphor.

In further detail, in a case where light or energy is incident to the surface of the phosphor, the light is scattered into various directions by the cracks 21, 22, and 23, thus resulting in a decrease in efficiency and lifetime of the light emitting device using the phosphor, for example, a light emitting diode ("LED").

In this regard, the efficiency of the LED using the phosphor may be represented by Formula 1.

LED efficiency=emission amount of phosphor−(C1+C2+C3)  Formula 1

C1: loss of light scattered by crack 21
C2: loss of light scattered by crack 22
C3: loss of light scattered by crack 23

In addition, where moisture permeates the cracks 21, 22, and 23, a tetravalent Mn atom ($Mn^{4+}$) having a high hydrophilic characteristic reacts with the moisture, such that the stoichiometry of the $K_2SiF_6:Mn^{4+}$ phosphor is broken and a unique function of the tetravalent Mn atom ($Mn^{4+}$) as an activator is damaged. Accordingly, the efficiency of the $K_2SiF_6:Mn^{4+}$ phosphor decreases.

A first embodiment provides a surface-modified phosphor 101 of which a surface is coated with a nano-sized phosphor 30.

Figure 4:
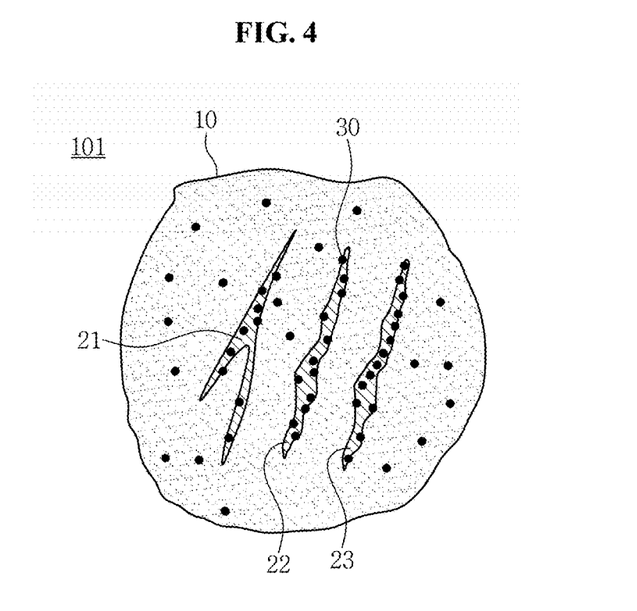
FIG. 4 is a schematic view illustrating a surface-modified phosphor according to a first embodiment.

FIG. 4 is a schematic view illustrating an embodiment of the surface-modified phosphor 101 according to the first embodiment.

The surface-modified phosphor 101 according to the first embodiment includes a phosphor matrix 10 including a compound represented by Chemical Formula 1 and the nano-sized phosphor 30 coated on the phosphor matrix 10.

$K_2SiF_6:Mn^{4+}$  Chemical Formula 1

The phosphor matrix 10 including the compound represented by Chemical Formula 1 may also be referred to as "$K_2SiF_6:Mn^{4+}$ phosphor."

The particle size of the phosphor matrix 10 may vary based on the purpose of use of the phosphor matrix 10. The phosphor matrix 10 has a particle size ranging from about 2 μm to about 200 μm. In more detail, the phosphor matrix 10 may have a particle size ranging from about 5 μm to about 50 μm. In a case where the phosphor matrix 10 has a highly uniform particle size distribution, the phosphor matrix 10 may have an average particle size ranging from about 10 μm to about 20 μm.

As illustrated in FIG. 4, the phosphor matrix 10 has the surface cracks 21, 22, and 23, and the nano-sized phosphor 30 is disposed in the cracks 21, 22, and 23. As the nano-sized phosphor 30 is disposed in the cracks 21, 22, and 23 so thin the cracks 21, 22, and 23 of the phosphor matrix 10 are filled with the nano-sized phosphor 30, light scattering occurring in the cracks 21, 22, and 23 may be suppressed. Accordingly, light loss at the phosphor is reduced, and thus the light emission efficiency may be enhanced. The nano-sized phosphor 30 may be disposed in an area aside from the cracks 21, 22, and 23.

The nano-sized phosphor 30 has a nanometer size. In detail, the nano-sized phosphor 30 has a particle size that may be inserted into the cracks 21, 22, and 23 of the phosphor matrix 10. For example, the nano-sized phosphor 30 may have a particle size ranging from about 20 nm to about 1000 nm. The particle size of the nano-sized phosphor 30 may vary based on the size of the cracks 21, 22, and 23 formed in the phosphor matrix 10.

According to the first embodiment, the nano-sized phosphor 30 may emit the same color as a color emitted by the phosphor matrix 10. Examples of the nano-sized phosphor 30 may include a phosphor including at least a compound represented by Chemical Formula 2 and a compound represented by Chemical Formula 3.

$Li_2TiO_3:Mn^{4+}$  Chemical Formula 2

$CaAlSiN:Eu^{2+}$  Chemical Formula 3

The phosphor including the compound represented by Chemical Formula 2 and the compound represented by Chemical Formula 3 are referred to as a nano-sized phosphor.

An activator of $Li_2TiO_3:Mn^{4+}$ is $Mn^{4+}$, which is the activator of the phosphor matrix 10. In addition, $Li_2TiO_3:Mn^{4+}$ has high excitation efficiency in a wavelength ranging from about 400 nm to about 500 nm, and has high emission efficiency in a wavelength of about 700 nm, which corresponds to a wavelength range of a red color.

Figure 5:
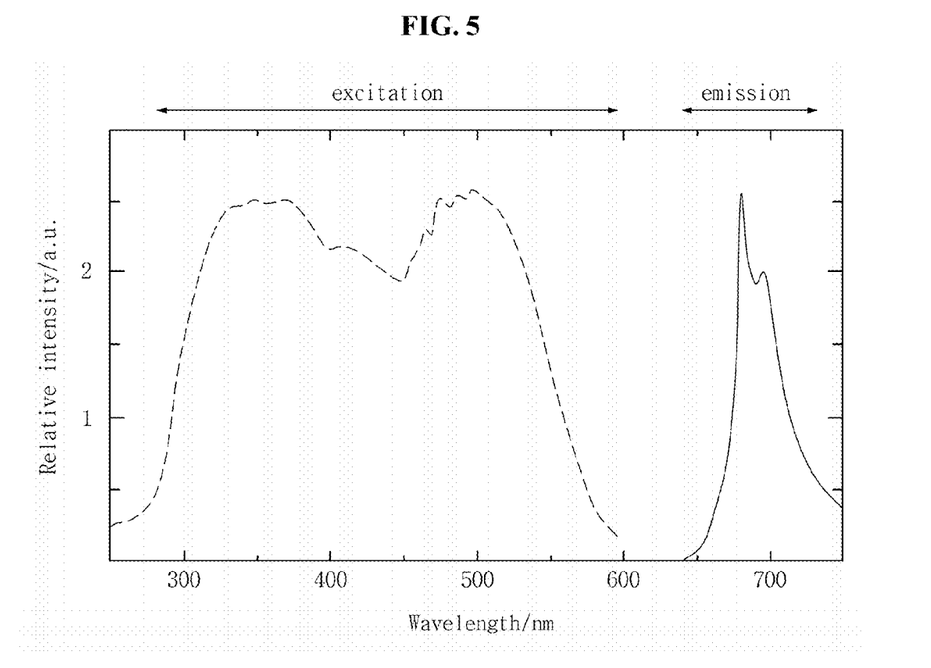
FIG. 5 is as graph of relative intensity (arbitrary units, a.u.) versus wavelength (nanometers, nm) which illustrates an excitation spectrum and an emission spectrum of a phosphor matrix.

FIG. 5 illustrates an excitation spectrum and an emission spectrum of the phosphor matrix 10. In reference to FIG. 5, $Li_2TiO_3:Mn^{4+}$ has high excitation efficiency and high emission efficiency in wavelength ranges similar to those of $K_2SiF_6:Mn^{4+}$, which is the phosphor matrix 10, respectively. Accordingly, $Li_2TiO_3:Mn^{4+}$, which is the nano-sized phosphor 30, may enhance light efficiency of the surface-modified phosphor 101 by compensating for the light emission of the phosphor matrix 10.

$CaAlSiN:Eu^{2+}$ may also be disposed in the cracks 21, 22, and 23 of the phosphor matrix 10 to thereby enhance light efficiency of the surface-modified phosphor 101.

Figure 6:
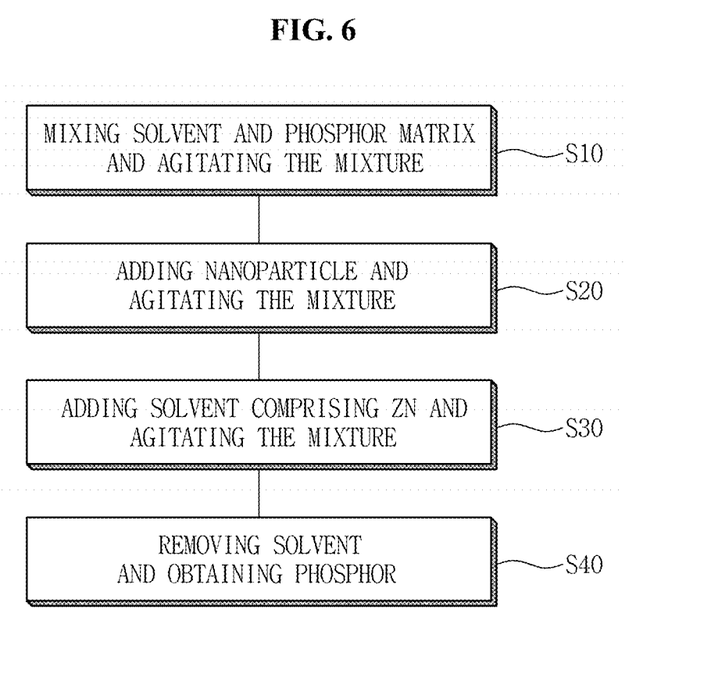
FIG. 6 is a flowchart illustrating a method of manufacturing the surface-modified phosphor according to the first embodiment.

Hereinafter, a method of manufacturing the surface-modified phosphor 101 according to the first embodiment will be described. FIG. 6 is a flowchart illustrating a method of manufacturing the surface-modified phosphor 101 according to the first embodiment Firstly, in process step S10, an alcohol and the phosphor matrix 10 are mixed and then firstly agitated.

Any suitable alcohol may be used. The alcohol may be methanol, ethanol, propanol, isopropanol, butanol, or a combination thereof. Ethanol is preferred.

The phosphor matrix 10 includes the compound represented by Chemical Formula 1, and may be manufactured using $KHF_2$, $KMnO_4$, and $H_2SiF_6$.

For example, 0.5 moles (mol) of $KHF_2$ powder and 0.05 mol of $KMnO_4$ powder are dissolved in a 49 weight percent (wt %) aqueous solution of hydrofluoric acid while being agitated, and 6 mL of a 30 wt % aqueous hydrogen peroxide solution is slowly added dropwise to the resultant solution to thereby obtain a yellow precipitate. Subsequently, a supernatant solution is removed, and the yellow precipitate is agitated in 70 mL of a 49 wt % aqueous solution of hydrofluoric acid for five minutes to remove residual $KHF_2$ in the precipitate. 1.2 mmol of resultant $K_2MnF_6$ is completely dissolved in 480 mL of an aqueous solution of hydrofluoric acid, and thereby an aqueous solution of hydrofluoric acid is prepared. 7.2 mmol of a 34% aqueous solution of $H_2SiF_6$ is mixed with the prepared aqueous solution of hydrofluoric acid, and the mixture is agitated for about 20 minutes to about 30 minutes. Subsequently, 86.4 mmol of a saturated aqueous solution of $KHF_2$ is slowly added dropwise to thereby obtain an orange precipitate. Subsequently, the precipitate is washed and dried. The dried precipitate is ground using a ball mill to thereby manufacture the phosphor matrix 10 including the compound represented by Chemical Formula 1 having a particle size ranging from about 2 μm to about 200 μm.

Subsequently, in process step S20, the nano-sized phosphor 30 is mixed to the firstly agitated material, and then the mixture is secondly agitated.

The nano-sized phosphor 30 may use one of a nano-sized phosphor including a compound represented by Chemical Formula 2 and a nano-sized phosphor including a compound represented by Chemical Formula 3.

$Li_2TiO_3:Mn^{4+}$  Chemical Formula 2

$CaAlSiN:Eu^{2+}$  Chemical Formula 3

$Li_2TiO_3:Mn^{4+}$, which is the compound of the nano-sized phosphor represented by Chemical Formula 2, may be prepared in manner.

Firstly, $Li_2CO_3$, $TiO_2$, and $MnCO_3$ are put in ethanol and agitated. Subsequently, the agitated material is sintered in a deoxidizing atmosphere at a pressure of 10 atmospheres to thereby form a pellet. The pellet is put in ethanol again and agitated to thereby form a wet pellet. The wet pellet is put in a ball-mill container, along with an aluminum ball and ethanol, and the container is rotated to perform a ball mill process. In such an embodiment, the particle size of $Li_2TiO_3:Mn^{4+}$ is determined based on the size of the aluminum ball and the rotation speed of the container. $Li_2TiO_3:Mn^{4+}$, which is the nano-sized phosphor 30, may have a particle size ranging from about 20 nm to about 1000 nm.

In addition, $CaAlSiN:Eu^{2+}$, which is the compound of the nano-sized phosphor represented by Chemical Formula 3, may be prepared in manner.

Firstly, $CaCO_3$, $AlN_3$, $SiN_4$, and $EuO_2$ are put in ethanol and then agitated. Subsequently, the agitated material is sintered in a deoxidizing atmosphere at a pressure of 10 atmospheres to thereby form a pellet. The pellet is put in ethanol again and agitated to thereby form a wet pellet. The wet pellet is put in a ball-mill container, along with an aluminum ball and ethanol, and the container is rotated to perform a ball mill process. In such an embodiment, the particle size of $CaAlSiN:Eu^{2+}$ is determined based on the size of the aluminum ball and the rotation speed of the container. $CaAlSiN:Eu^{2+}$, which is the nano-sized phosphor 30, may have a particle size ranging from about 200 nm to about 1000 nm.

Subsequently, in S30, a solvent comprising Zn, i.e., a solvent in which a compound comprising Zn is disposed, e.g., dissolved, is input to the secondly agitated material, and the mixture is thirdly agitated.

The solvent comprising Zn may include an aqueous solution of $Zn_2SO_4$ having a concentration ranging from about 0.5% to about 1.5%.

Subsequently, in process step S40, the solvent is removed, and thereby the surface-modified phosphor 101 coated with the nano-sized phosphor 30 is obtained.

The surface-modified phosphor 101 according to the first embodiment prepared in the manner described in the foregoing may have a high lumen maintenance rate.

In order to verify the lumen maintenance rate, a lumen maintenance rate test and a chromaticity coordinate variation test are carried out on the surface-modified phosphor 101 while varying the content of the nano-sized phosphor 30 coated on the phosphor matrix 10. The phosphor matrix 10 uses $K_2SiF_6:Mn^{4+}$ having an average diameter of about 20 μm, and the nano-sized phosphor 30 uses $Li_2TiO_3:Mn^{4+}$ having an average diameter of about 200 nm.

In detail, an experimental example 1 (Ex. 1) including the surface-modified phosphor 101 containing the nano-sized phosphor 30 in an amount of 3 wt % with respect to the total weight of the surface-modified phosphor 101, an experimental example 2 (Ex. 2) including the surface-modified phosphor 101 containing the nano-sized phosphor 30 in an amount of 4 wt % with respect thereto, an experimental example 3 (Ex. 3) including the surface-modified phosphor 101 containing the nano-sized phosphor 30 in an amount of 5 wt % with respect thereto, an experimental example 4 (Ex. 4) including the surface-modified phosphor 101 containing the nano-sized phosphor 30 in an amount of 6 wt % with respect thereto, an experimental example 5 (Ex. 5) including the surface-modified phosphor 101 containing the nano-sized phosphor 30 in an amount of 7 wt % with respect thereto, and an experimental example 6 (Ex. 6) including the surface-modified phosphor 101 containing the nano-sized phosphor 30 in an amount of 8 wt % with respect thereto are manufactured.

In addition, for comparison, a phosphor matrix 10 not coated with the nano-sized phosphor 30 is used as a comparative example 1 (Comp. 1).

Figure 7:
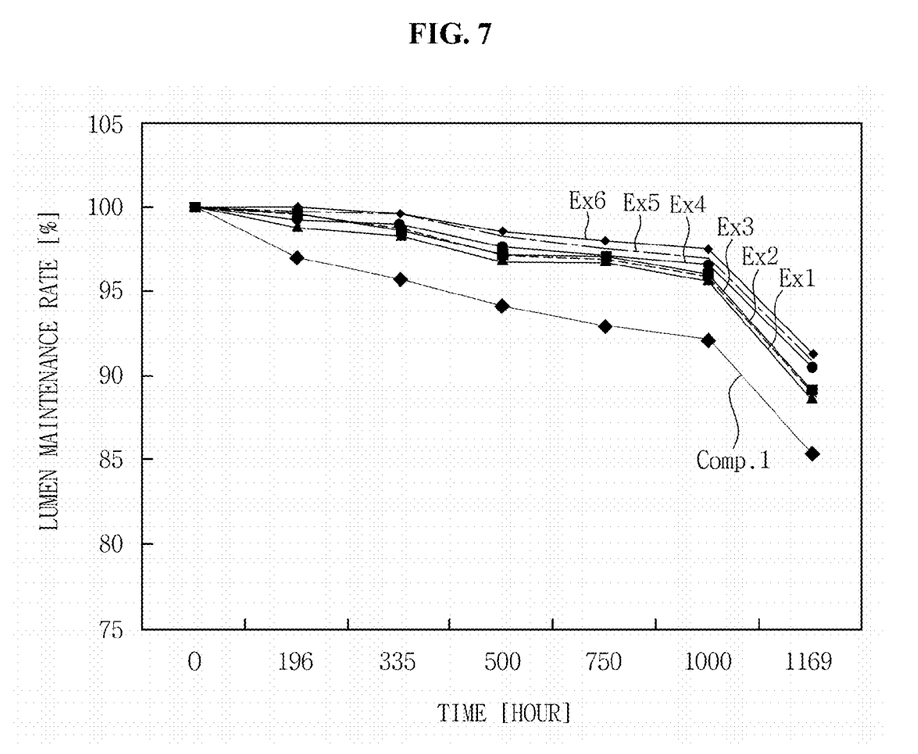
FIG. 7 is a graph of lumen maintenance rate (percent, %) versus time (hours) illustrating a lumen maintenance rate of a phosphor over time.

A result from the lumen maintenance rate test is shown in FIG. 7. FIG. 7 is a graph illustrating a lumen maintenance rate of the phosphor over time.

In detail, FIG. 7 illustrates a lumen maintenance rate over time at a temperature of 60° C. and a humidity of 75%. In reference to FIG. 7, it is verified that the phosphors according to the experimental examples 1 to 6 (Ex. 1 to Ex. 6) exhibit a high lumen maintenance rate, as compared to that of the comparative example 1 (Comp. 1).

Figure 8:
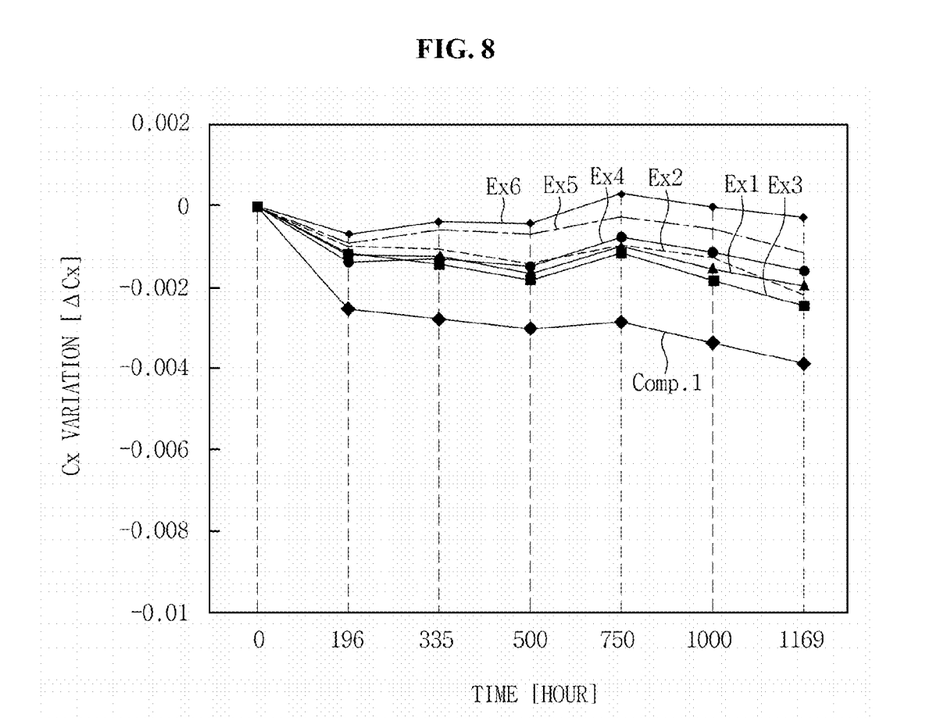
FIG. 8 is a graph of Cx variation (change in Cx) versus time (hours) illustrating chromaticity coordinate variation of a phosphor over time.

FIG. 8 is a graph illustrating chromaticity coordinate variation of a phosphor over time. The chromaticity coordinates uses CIE 1931 chromaticity coordinates, and variation in x-axis of the chromaticity coordinates is measured. Based on the CIE 1931 chromaticity coordinates, the $K_2SiF_6:Mn^{4+}$ sphor has an x-axis chromaticity coordinate value of 0.702 and ay-axis chromaticity coordinate value of 0.311.

FIG. 8 illustrates an amount of variation (ΔCx) of the x-axis chromaticity coordinate value over time. In reference to FIG. 8, it is verified that the phosphors according to the experimental examples 1 to 6 (Ex. 1 to Ex. 6) have a small degree of variation (ΔCx) in chromaticity coordinates, as compared to that of the comparative example 1 (Comp. 1). That is, the phosphors according to the experimental examples 1 to 6 (Ex. 1 to Ex. 6) have a relatively small degree of variation (ΔCx) in an emitted color over time.

Figure 9:
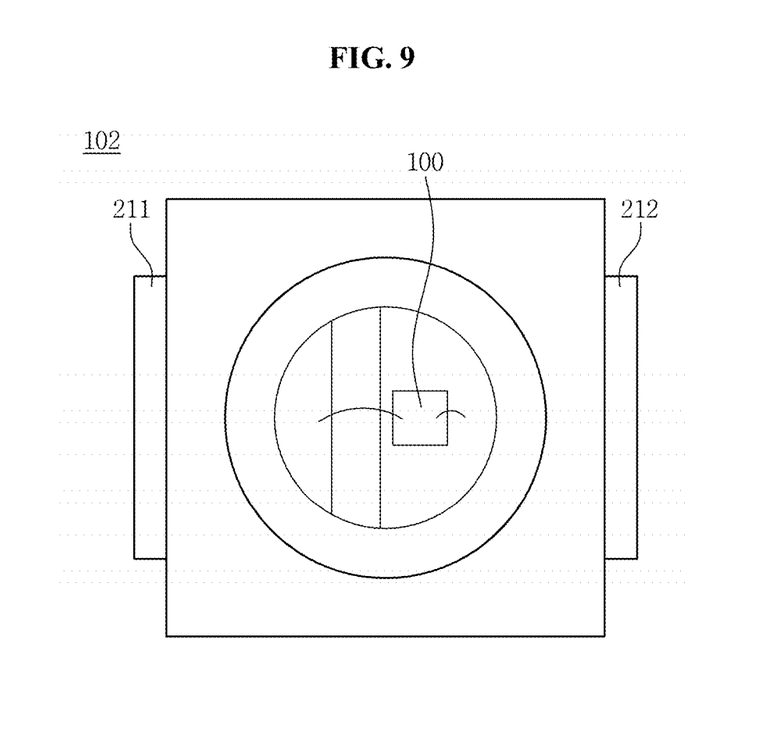
FIG. 9 is a plan view of an embodiment of a light emitting device according to a second embodiment.

Hereinafter, a light emitting device 102 according to a second embodiment will be described with reference to FIGS. 9 and 10. FIG. 9 is a plan view illustrating the light emitting device 102 according to the second embodiment, and FIG. 10 is a cross-sectional view illustrating the light emitting device 102 according to the second embodiment.

Figure 10:
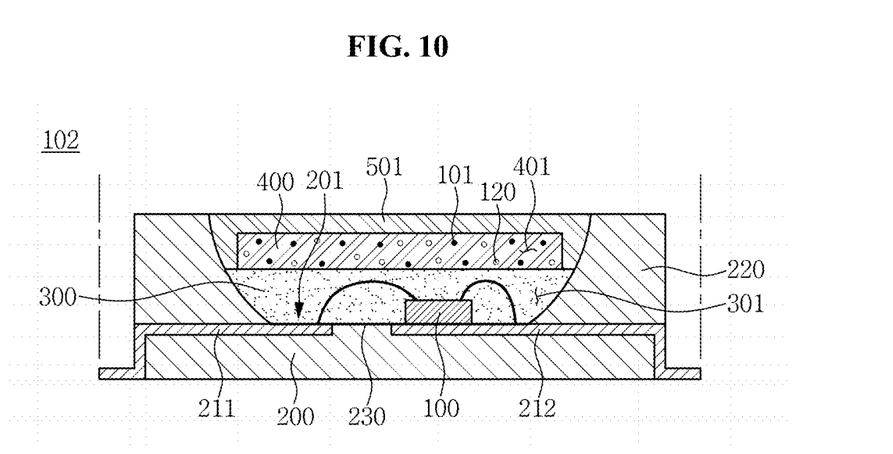
FIG. 10 is a cross-sectional view of an embodiment of the light emitting device according to the second embodiment.

In reference to FIGS. 9 and 10, the light emitting device 102 according to the second embodiment includes a substrate 200 having a first surface 201, a light emitting element 100 disposed on the first surface 201 of the substrate 200 and emitting excitation light, and a wavelength conversion portion 400 configured to absorb the excitation light to thereby emit visible light.

The substrate 200 may include or be formed of a resin that is opaque or has a high reflectivity, and in particular, may include or be formed of a polymer resin that may facilitate an injection process. However, the substrate 200 is not limited thereto, and may include or be formed of various non-conductive materials. That is, the substrate 200 may include or be formed of a non-conductive material such as ceramic. In addition, the substrate 200 may be a printed circuit board ("PCB") formed with a wiring pattern.

The substrate 200 may include a cavity (not illustrated) accommodating the light emitting element 100 and a partition wall 220 enclosing the light emitting element 100. In addition, the substrate 200 may include a pair of lead frames 211 and 212 electrically connected to the light emitting element 100 so as to apply a driving power to the light emitting element 100. The pair of lead frames 211 and 212 may directly contact the light emitting element 100 or may be electrically connected to the light emitting element 100 by a conductive wiring. In addition, the lead frames 211 and 212 may be used as a terminal for applying an external electric signal. To this end, the lead frames 211 and 212 may include or be formed of a metal material having excellent electric conductivity.

The light emitting element 100 is disposed on the first surface 201 of the substrate 200. Any suitable element that emits light upon being applied with an electric signal may be used as the light emitting element 100. A representative example of the light emitting element 100 may include a semiconductor light emitting element. For example, the light emitting element 100 may include an n-type semiconductor layer, a p-type semiconductor layer, and an activation layer interposed therebetween. Herein, the activation layer may include or be formed of a nitride semiconductor.

The light emitting element 100 may emit blue light, but is not limited thereto.

The wavelength conversion portion 400 may emit visible light that is excited by light emitted from the light emitting element 100 to be converted in terms of wavelength. The wavelength conversion portion 400 includes a first resin layer 401 and a surface-modified phosphor 101 dispersed in the first resin layer 401. The first resin layer 401 may include or be formed of at least one selected from: an epoxy resin, a silicone resin, a modified silicone resin, a urethane resin, an oxetane resin, an acrylic resin, a polycarbonate resin, a polyimide resin, and a combination thereof.

The surface-modified phosphor 101 may use the surface-modified phosphor 101 according to the first embodiment. The surface-modified phosphor 101 is a red phosphor that absorbs excitation light to emit red light.

In addition, the wavelength conversion portion 400 may further include a green phosphor 120 that emits green light, in addition to the surface-modified phosphor 101 that emits red light, where necessary.

The light emitting device 102 according to the second embodiment includes a lower filling portion 300 and a cover portion 501, and the wavelength conversion portion 400 is encapsulated by at least one of the substrate 200, the lower filling portion 300, and the cover portion 501.

The lower filling portion 300 fills a space between the wavelength conversion portion 400 and the first surface 201 of the substrate 200, thus separating the wavelength conversion portion 400 from the first surface 201 of the substrate 200, and accordingly, the wavelength conversion portion 400 may be protected from moisture externally permeating the substrate 200 to the first surface 201 of the substrate 200. The lower filling portion 300 may include a second resin layer 301 including a resin. The second resin layer 301 may include or be formed of at least one selected from: an epoxy resin, a silicone resin, a modified silicone resin, a urethane resin, an oxetane resin, an acrylic resin, a polycarbonate resin, a polyimide resin, and a combination thereof.

In addition, the substrate 200 may further include a moisture-resistance coating layer 230 on the first surface 201 on which the light emitting element 100 is disposed. The moisture-resistance coating layer 230 may include or be formed of at least one of a fluorine-based coating composition and a silica-based coating composition, and accordingly, moisture permeation may be more efficiently prevented.

In such an embodiment, a resin material forming the second resin layer 301 provide in the lower filling portion 300 and a resin material forming the first resin layer 401 provided in the wavelength conversion portion 400 may have different refractive indices from each other. For example, the refractive index of the resin material forming the second resin layer 301 may be greater than the refractive index of the resin material forming the first resin layer 401. In such an embodiment, when light emitted from the light emitting element 100 is transmitted through the second resin layer 301 and the first resin layer 401 to be emitted externally, a difference in refractive index with respect to an external material (air) decreases so that total reflection caused due to the difference in refractive index decreases, and thereby light extraction efficiency may be enhanced.

The cover portion 501 is disposed on the wavelength conversion portion 400, and covers an upper portion of the wavelength conversion portion 400. Accordingly, moisture permeating the upper portion of the wavelength conversion portion 400 may be efficiently reduced or prevented. The cover portion 501 may include or be formed of a material including glass.

Figure 11:
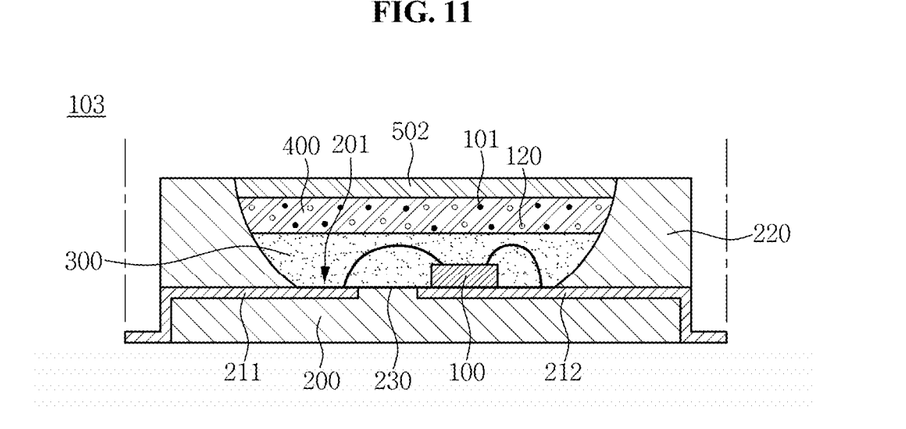
FIG. 11 is a cross-sectional view of an embodiment of a light emitting device according to a third embodiment.

FIG. 11 is a cross-sectional view illustrating a light emitting device 103 according to a third embodiment.

The light emitting device 103 according to the third embodiment has a structure in which a cover portion 502 covers only an upper portion of a wavelength conversion portion 400, which is dissimilar to the structure of the light emitting device 102 illustrated in FIG. 10, rather than the cover portion 502 covering both of the upper portion and a side portion of the wavelength conversion portion 400.

Figure 12:
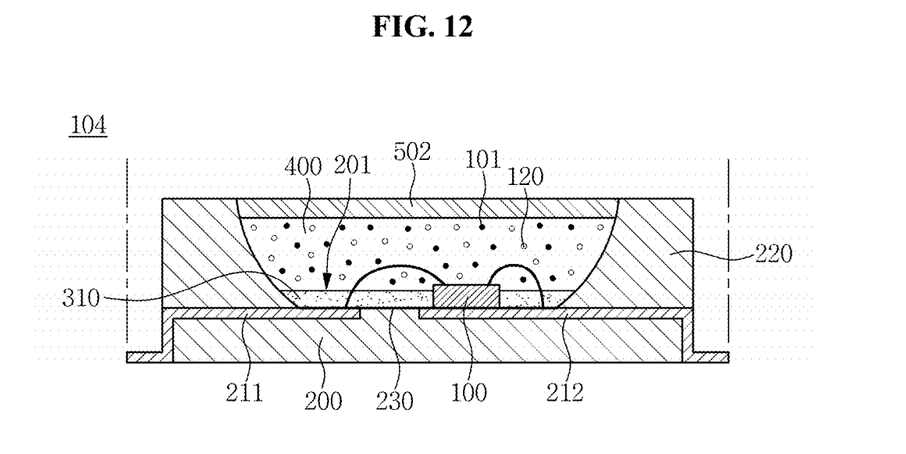
FIG. 12 is a cross-sectional view of an embodiment of a light emitting device according to a fourth embodiment.

FIG. 12 is a cross-sectional view illustrating a light emitting device 104 according to a fourth embodiment.

The light emitting device 104 according to the fourth embodiment has a structure in which a lower filling portion 310 is disposed to allow an upper portion of a light emitting element 100 to be open, which is dissimilar to the structure of the light emitting device 103 illustrated in FIG. 11, rather than the lower filling portion 310 covering the upper portion of the light emitting element 100. In such an embodiment, it is not necessary that the lower filling portion 310 be formed of a transparent material, and the lower filling portion 310 may include or be formed of a reflective material that may readily reflect light emitted from the light emitting element 100 upwards.

Hereinafter, a backlight unit 105 according to a fifth embodiment will be described with reference to FIG. 13.

Figure 13:
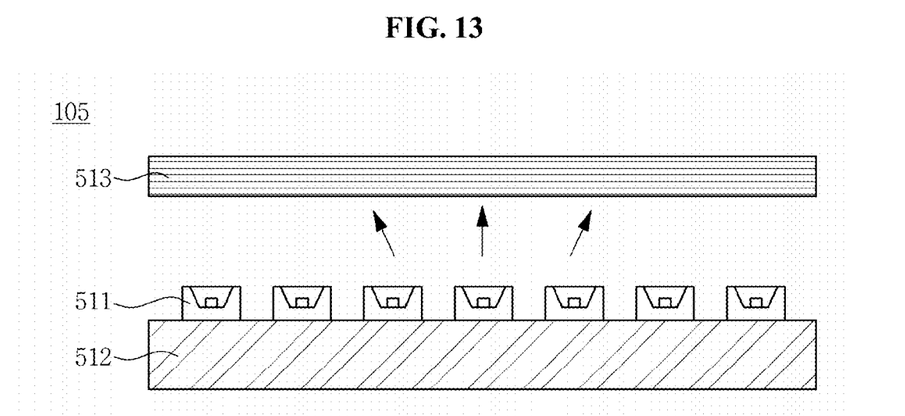
FIG. 13 is a cross-sectional view of an embodiment of a backlight unit according to a fifth embodiment.

FIG. 13 is a cross-sectional view illustrating the backlight unit 105 according to the fifth embodiment.

In reference to FIG. 13, the backlight unit 105 includes a substrate 512, a light source 511 on the substrate 512, and at least one optical sheet 513 on an upper portion of the light source 511. The light source 511 is the light emitting device 102 according to the second embodiment.

The backlight unit 105 according to the fifth embodiment emits light toward an upper portion in which an LCD panel is disposed.

Figure 14:
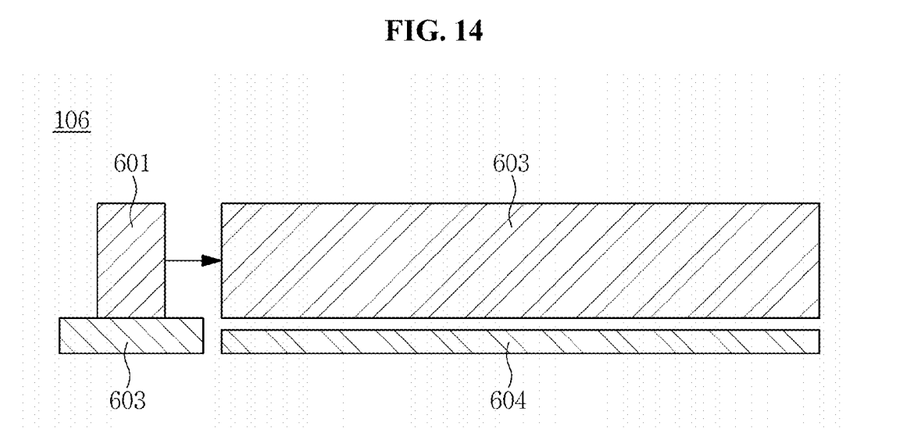
FIG. 14 is a cross-sectional view of an embodiment of a backlight unit according to a sixth embodiment.

FIG. 14 is a cross-sectional view illustrating a backlight unit 106 according to a sixth embodiment.

The backlight unit 106 according to the sixth embodiment emits light in a sideward direction, rather than emitting light in an upward direction.

In detail, in the backlight unit 106 according to the sixth embodiment, a light source 601 mounted on a substrate 602 emits light in the sideward direction, and the light emitted in such a manner may be incident to a light guide plate 603 to be converted into a form of a surface light source. The light transmitted through the light guide plate 603 is emitted upwards, and a reflective layer 604 is disposed on a lower surface of the light guide plate 603 to thereby enhance light extraction efficiency. Herein, the light source 601 is the light emitting device 102 according to the second embodiment.

Hereinafter, a display device 107 according to a seventh embodiment will be described with reference to FIG. 15.

Figure 15:
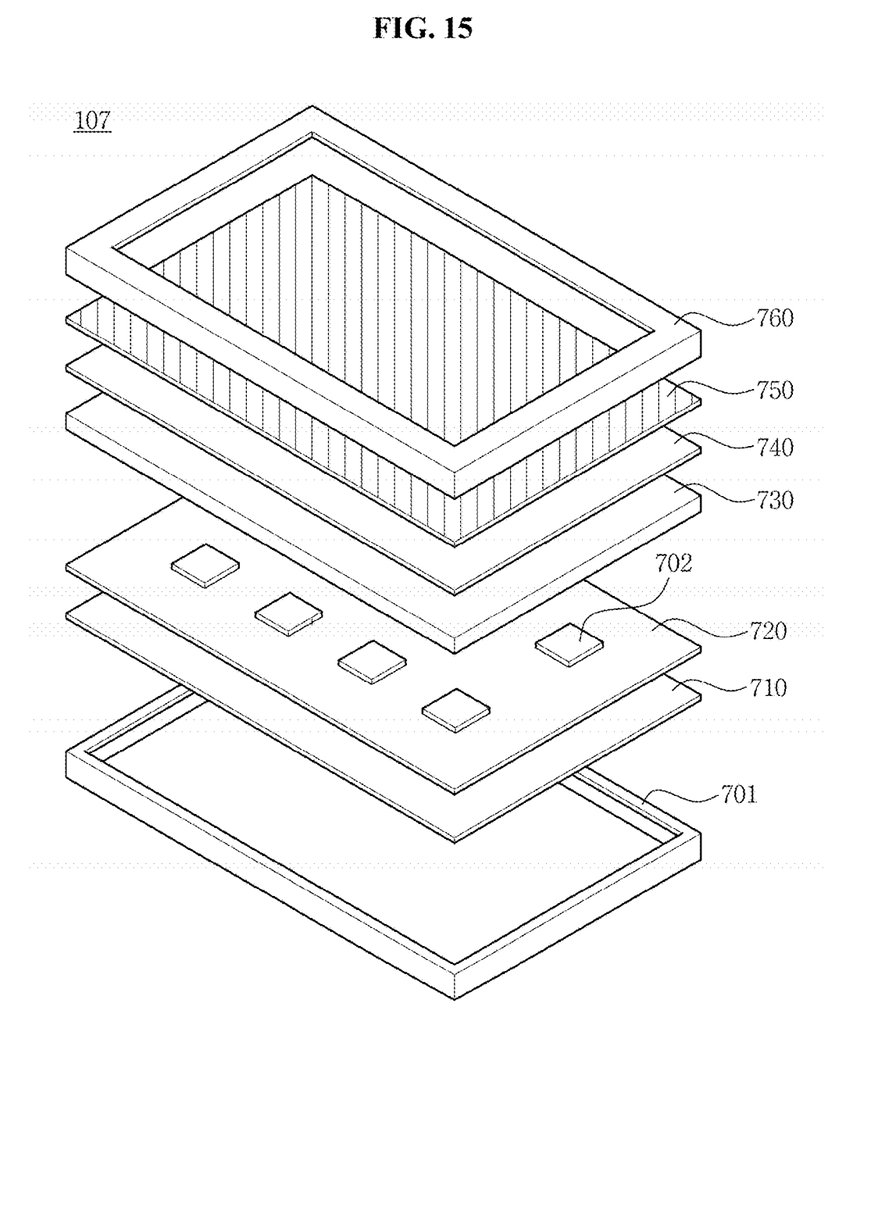
FIG. 15 is an exploded perspective view of an embodiment of a display device according to a seventh embodiment.

FIG. 15 is an exploded perspective view illustrating the display device 107 according to the seventh embodiment.

In reference to FIG. 15, the display device 107 according to the seventh embodiment includes a substrate 720 including a lower cover 701, a reflective sheet 710, and a light source 702, an optical film including a diffusion sheet 730 and a prism sheet 740, a display panel 750, and an upper cover 760. Herein, the light source 702 is the light emitting device 102 according to the second embodiment. In addition, the substrate 702 may be a circuit board that may transmit a power and an electric signal to the light source 702.

The lower cover 701 may have a box shape having an opening in an upper surface, and may accommodate the light source 702. The upper cover 760 encloses an edge portion of the optical film including the diffusion sheet 730 and the prism sheet 740, and may be assembled to the lower cover 701 to be coupled thereto.

The diffusion sheet 730 may scatter light emitted from the light source 702 to be uniformly irradiated to an entire portion of the panel, and the prism sheet 740 may enhance luminance of light scattered by the diffusion sheet 730. Although not illustrated, a protective sheet may further be disposed above the prism sheet 740 to protect the prism sheet 740.

The display panel 750 may be disposed between the optical film including the diffusion sheet 730 and the prism sheet 740 and the upper cover 760. The display panel 750 may be an LCD panel. The LCD panel may include a pair of a lower substrate (not illustrated) and an upper substrate (not illustrated) facing each other with a liquid crystal layer interposed therebetween.

A color filter, a black matrix, a common electrode, and the like are provided in the upper substrate.

A thin film transistor and a pixel electrode connected to the thin film transistor may be provided in the lower substrate. Herein, the common electrode provided in the upper substrate may be formed in the lower substrate based on a mode of liquid crystals, and the color filter or the black matrix formed in the upper substrate so as to increase an aperture ratio or the like may be formed in the lower substrate.

As set forth above, the surface-modified phosphor according to the embodiments has a structure in which a surface of the phosphor matrix is coated with the nanometer-sized phosphor having the same color as that of the phosphor matrix, such that deterioration of the phosphor due to a surface crack may be prevented.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings. Various features of the above described and other embodiments can be mixed and matched in any manner, to produce further embodiments consistent with the invention.

What is claimed is:

1. A surface-modified phosphor comprising:
    a phosphor matrix comprising
        a compound represented by Chemical Formula 1

$$K_2SiF_6:Mn^{4+}; \text{ and} \hspace{2cm} \text{Chemical Formula 1}$$

a nano-sized phosphor disposed on the phosphor matrix,
    wherein the phosphor matrix has a crack, and wherein the crack is filled with the nano-sized phosphor, and
    wherein the nano-sized phosphor comprises at least a compound represented by any one of Chemical Formulas 2 and 3, $$Li_2TiO_3:Mn^{4+}, \text{ and} \hspace{2cm} \text{Chemical Formula 2}$$

$$CaAlSiN:Eu^{2+}. \hspace{2cm} \text{Chemical Formula 3}$$

2. The surface-modified phosphor of claim 1, wherein the phosphor matrix has a particle size ranging from about 2 micrometers to about 200 micrometers.

3. The surface-modified phosphor of claim 1, wherein the nano-sized phosphor has a particle size ranging from about 20 nanometers to about 1000 nanometers.

4. The surface-modified phosphor of claim 1, wherein the nano-sized phosphor emits a color which is the same as a color emitted by the phosphor matrix.

5. The surface-modified phosphor of claim 1, wherein the nano-sized phosphor comprises a compound represented by Chemical Formulas 2 and 3.

6. A method of manufacturing a surface-modified phosphor, the method comprising:
    mixing an alcohol and a phosphor matrix and agitating the mixture to obtain first agitated material;
    mixing a nano-sized phosphor and the first agitated material and agitating the mixture to obtain second agitated material;
    adding a solvent comprising Zn to the second agitated material and agitating the mixture to obtain third agitated material; and
    removing the solvent from the third agitated material to manufacture the surface-modified phosphor,
    wherein the surface-modified phosphor comprises
        a phosphor matrix comprising
            a compound represented by Chemical Formula 1

$$K_2SiF_6:Mn^{4+}; \text{ and} \hspace{2cm} \text{Chemical Formula 1}$$

a nano-sized phosphor disposed on the phosphor matrix,
    wherein the phosphor matrix has a crack, and wherein the crack is filled with the nano-sized phosphor, and wherein the nano-sized phosphor comprises at least a compound represented by any one of Chemical Formulas 2 and 3, $Li_2TiO_3:Mn^{4+}$, and      Chemical Formula 2

$CaAlSiN:Eu^{2+}$.      Chemical Formula 3

7. The method of claim 6, wherein the alcohol is ethanol.

8. The method of claim 6, wherein the solvent comprising Zn is an aqueous solution of $Zn_2SO_4$ having a concentration ranging from about 0.5 weight percent to about 1.5 weight percent, based on a total weight of the aqueous solution.

9. The method of claim 6, wherein the phosphor matrix has a particle size ranging from about 2 micrometers to about 200 micrometers.

10. The method of claim 6, wherein the nano-sized phosphor has a particle size ranging from about 20 nanometers to about 1000 nanometers.

11. The method of claim 6, wherein the nano-sized phosphor comprises a compound represented by Chemical Formulas 2 and 3.

12. A light emitting device comprising:
a substrate;
a light emitting element on the substrate; and
a wavelength conversion portion on the light emitting element, the wavelength conversion portion comprising a surface-modified phosphor,
wherein the surface-modified phosphor comprises a phosphor matrix comprising
a compound represented by Chemical Formula 1

$K_2SiF_6:Mn^{4+}$; and      Chemical Formula 1 a nano-sized phosphor coated on the phosphor matrix, wherein the phosphor matrix has a crack, and wherein the crack is filled with the nano-sized phosphor, and
wherein the nano-sized phosphor comprises at least a compound represented by any one of Chemical Formulas 2 and 3, $Li_2TiO_3:Mn^{4+}$, and      Chemical Formula 2

$CaAlSiN:Eu^{2+}$.      Chemical Formula 3

13. The display device of claim 12, wherein the phosphor matrix has a particle size ranging from about 2 micrometers to about 200 micrometers.

14. The display device of claim 12, wherein the nano-sized phosphor has a particle size ranging from about 20 nanometers to about 1000 nanometers.

15. The display device of claim 12, wherein the nano-sized phosphor emits a color which is the same as a color emitted by the phosphor matrix.

16. The display device of claim 12, wherein the nano-sized phosphor comprises a compound represented by Chemical Formulas 2 and 3.

* * * * *